United States Patent
Wagner et al.

[11] Patent Number: 5,309,322
[45] Date of Patent: May 3, 1994

[54] LEADFRAME STRIP FOR SEMICONDUCTOR PACKAGES AND METHOD

[75] Inventors: Robert Wagner, Mesa; Michael R. Shields; Samuel L. Coffman, Scottsdale, all of Ariz.

[73] Assignee: Motorola, Inc., Schaumburg, Ill.

[21] Appl. No.: 959,573

[22] Filed: Oct. 13, 1992

[51] Int. Cl.$^5$ ............................................. H05K 7/20
[52] U.S. Cl. .................... 361/723; 174/252; 257/675; 29/844; 361/761; 361/778
[58] Field of Search ............... 438/901; 29/843, 844; 165/80.3, 185; 174/16.3, 252, 258, 260; 257/675, 676, 705–707; 361/386–388, 401, 389, 421, 403, 408, 410, 414, 400, 702, 704, 707, 709, 723, 760, 762, 767, 778

[56] References Cited

U.S. PATENT DOCUMENTS

| | | | |
|---|---|---|---|
| 3,735,485 | 5/1973 | Wilson. | |
| 4,225,900 | 9/1980 | Ciccio et al. | 361/410 |
| 4,339,860 | 6/1982 | Hayashi | 29/413 |
| 4,456,712 | 6/1984 | Christie | 523/439 |
| 4,975,761 | 12/1990 | Chu | 361/386 |
| 4,982,311 | 1/1991 | Dehaine et al. | 361/401 |
| 4,994,215 | 2/1991 | Wiech, Jr. | 264/27 |
| 5,012,386 | 4/1991 | McShane | 361/386 |
| 5,095,404 | 3/1992 | Chao | 361/385 |
| 5,099,395 | 3/1992 | Sagisaka et al. | 361/410 |
| 5,151,771 | 9/1992 | Hiroi et al. | 361/410 |
| 5,176,255 | 1/1993 | Seidler | 206/331 |

*Primary Examiner*—Gerald P. Tolin
*Attorney, Agent, or Firm*—Robert F. Hightower; Joe E. Barbee

[57] ABSTRACT

A substantially planar insulating sheet of high temperature printed circuit board material (11) is used to form a leadframe strip (18, 19, 21) for a semiconductor package (20). The leadframe strip (18, 19, 21) includes a die attach opening (12) through the insulating sheet (11). A plurality of metallized areas (13, 22, 23) on the insulating sheet (11) form bonding pads (13) and package leads (22). Conductive holes (14) electrically connect the bonding pads (13) and the package leads (22).

11 Claims, 2 Drawing Sheets

LEADFRAME STRIP FOR SEMICONDUCTOR PACKAGES AND METHOD

BACKGROUND OF THE INVENTION

The present invention relates, in general, to semiconductor packages, and more particularly, to leadframes for semiconductor packages.

A variety of package styles and leadframes have previously been utilized in packaging semiconductor devices. In order to obtain high thermal dissipation capability, generally greater than 1 watt, previous packages usually employ an insulated leadframe that is formed from a number of individual piece parts. One particular insulated package includes a plurality of individual leads that are attached to a heatsink by a plurality of small ceramic insulators that electrically insulate the leads from the heatsink.

Assembling an insulated leadframe from individual piece parts requires several assembly steps that result in a high leadframe cost. During assembly, components are often misaligned thereby destroying the leadframe and adding to the overall cost of good leadframes. Also, several precision assembly operations typically are required to assemble the piece parts into a package which further adds to the package's cost.

Accordingly, it is desirable to have an insulated leadframe that has low cost components, that does not require precision alignments to assemble the leadframe; and to have a low cost high thermal conductivity package using the leadframe.

SUMMARY OF THE INVENTION

Briefly stated, the present invention includes a leadframe strip that is formed from a substantially planar insulating sheet. The leadframe strip includes a die attach opening through the insulating sheet. A plurality of metallized areas on the insulating sheet form bonding pads and package leads. Conductive holes electrically connect the bonding pads and the package leads.

DETAILED DESCRIPTION OF THE DRAWINGS

Figure 1:
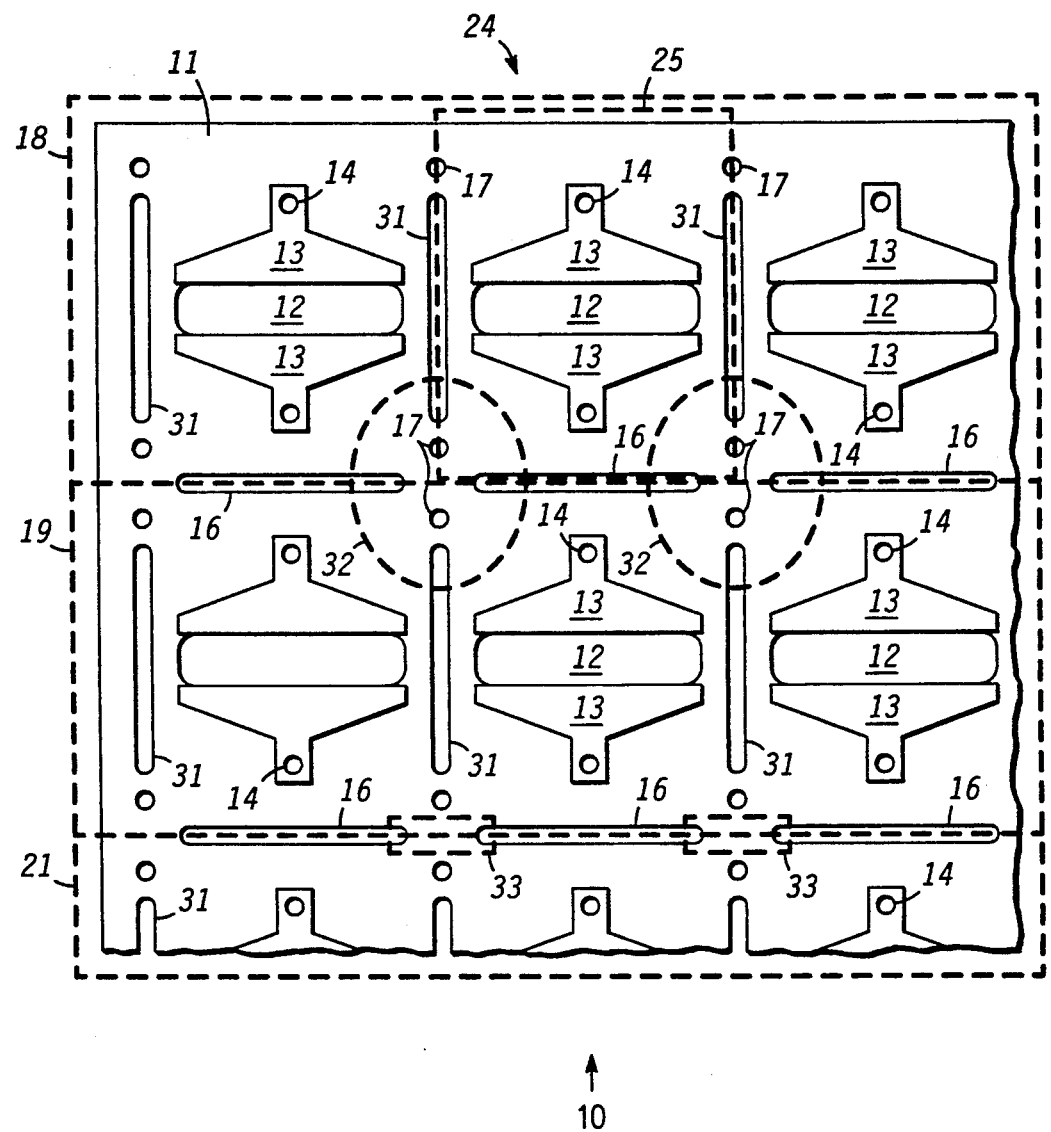
FIG. 1 illustrates a top view of a portion of a leadframe panel in accordance with the present invention.

FIG. 1 illustrates a portion of a leadframe panel 10 that includes a plurality of leadframe strips 18, 19, and 21 which are subsequently separated from panel 10. Thereafter, strips 18, 19, and 21 can be employed as conventional leadframe strips for assembling semiconductor packages. Each of strips 18, 19, and 21 include a plurality of leadframes such as a leadframe 24 that is outlined by a dashed line 25. Strips 18, 19, and 21 are formed on a substantially planar insulating sheet 11 having conductive areas attached to a top and a bottom surface of sheet 11 Suitable materials for sheet 11 include a variety of printed circuit board materials that can withstand soldering at temperatures of approximately 300 to 350 degrees Celsius (° C.). Such materials include high temperature fiberglass epoxy, bismaleimide triazine epoxy (BT epoxy), polyimide, etc. onto which metallized conductor areas are attached. Standard FR10 printed circuit board material does not withstand these high temperatures and generally is not suitable. Each leadframe 24 includes a die attach opening 12 that is formed through sheet 11. The length and width of opening 12 is selected for the particular semiconductor die that will subsequently be positioned therein. In the preferred embodiment, opening 12 has rectangular shape with a length of approximately 1.5 to 1.8 millimeters, and a width of approximately 1.0 to 1.5 millimeters.

Attached to a top surface of each leadframe 24 are metallized areas flanking two opposite sides of each opening 12 in order to function as a plurality of bonding pads 13. One edge of each bonding pad 13 is adjacent to opening 12, and has a length that is substantially equal to the length of opening 12. This length is chosen to provide sufficient area to attach multiple wire bonds to each pad 13. A rectangular portion of pad 13 projects perpendicularly away from opening 12. In order to form electrical connection to a second surface of each leadframe 24, a plated through hole or electrically conductive hole 14 is formed through a distal end of the projection. In the preferred embodiment, the projecting portion of pad 13 has a width of approximately 1.0 to 1.5 millimeters, and hole 14 has a diameter of approximately 0.5 to 0.75 millimeters.

Since pads 13 are used for wire bonding, the material employed for pads 13 must be compatible with the bonding wire material. Typical materials for areas 13 include solder plated copper, gold plated copper, nickel plated copper, and copper that is covered by a layer of nickel followed by a layer of gold. In the preferred embodiment, the metallization is approximately 30 to 80 microns thick and includes copper covered by nickel then gold.

A plurality of strip separation slots 16 are provided to facilitate separating strips 18, 19, and 21. Slots 16 are openings through sheet 11 that are positioned parallel to each opening 12, and near or on the perimeter of each leadframe 24. Slots 16 minimize the amount of material that must be removed in order to separate strips 18, 19, and 21, and can have a variety of shapes and sizes depending on the configuration of each leadframe 24. In the preferred embodiment, each slot 16 has an oval shape, is centered to opening 12, and has a length substantially equal to the length of opening 12. Also in this preferred embodiment, leadframe 24 has a width of approximately 4.0 to 5.0 millimeters, and a length of approximately 5.5 to 6.0 millimeters. As illustrated by dashed lines 33, separation of strips 18, 19, and 21 can be accomplished by using a punch that is sufficiently large to remove the material between each slot 16 and overlap each slot 16. For the sake of clarity, only two dashed lines 33 are shown. Two additional dashed lines 33 would normally be shown overl pping the boundary of strips 18 and 19. Similarly, a plurality of leadframe separation slots 31 facilitate singularizing each individual leadframe 24 from its respective strip 18, 19, or 21. Similar to slots 16, slots 31 can have a variety of shapes and sizes that are determined by the shape and size of leadframe 24. In the preferred embodiment, slots 31 have an oval shape, and are perpendicular to and centered to each die attach opening 12, and have a length that is substantially equal to the distance between holes 14.

Alternately, the plurality of leadframes 24 can be simultaneously singularized by employing a punch that overlaps slots 16 and 31 as illustrated by dashed lines 32.

This alternate technique directly singularizes each leadframe 24 from panel 10, and by-passes the stage of creating strips 18, 19, and 21. For the sake of clarity, only two dashed lines 32 are shown although two additional dashed lines 32 would normally be shown overlapping slots 16 that are on the boundary of strips 19 and 21.

A plurality of indexing holes 17 are used for locating and aligning sheet 11 during the manufacturing of panel 10. Subsequent to separating strips 18, 19, and 21, holes 17 are used to align strips 18, 19, and 21 during the process of assembling semiconductor packages. Within each strip 18, 19, and 21, holes 17 typically are aligned along the axis of slots 31 and spaced away from slots 16 to prevent damaging holes 17 while punching panel 10 along lines 33.

Figure 2:
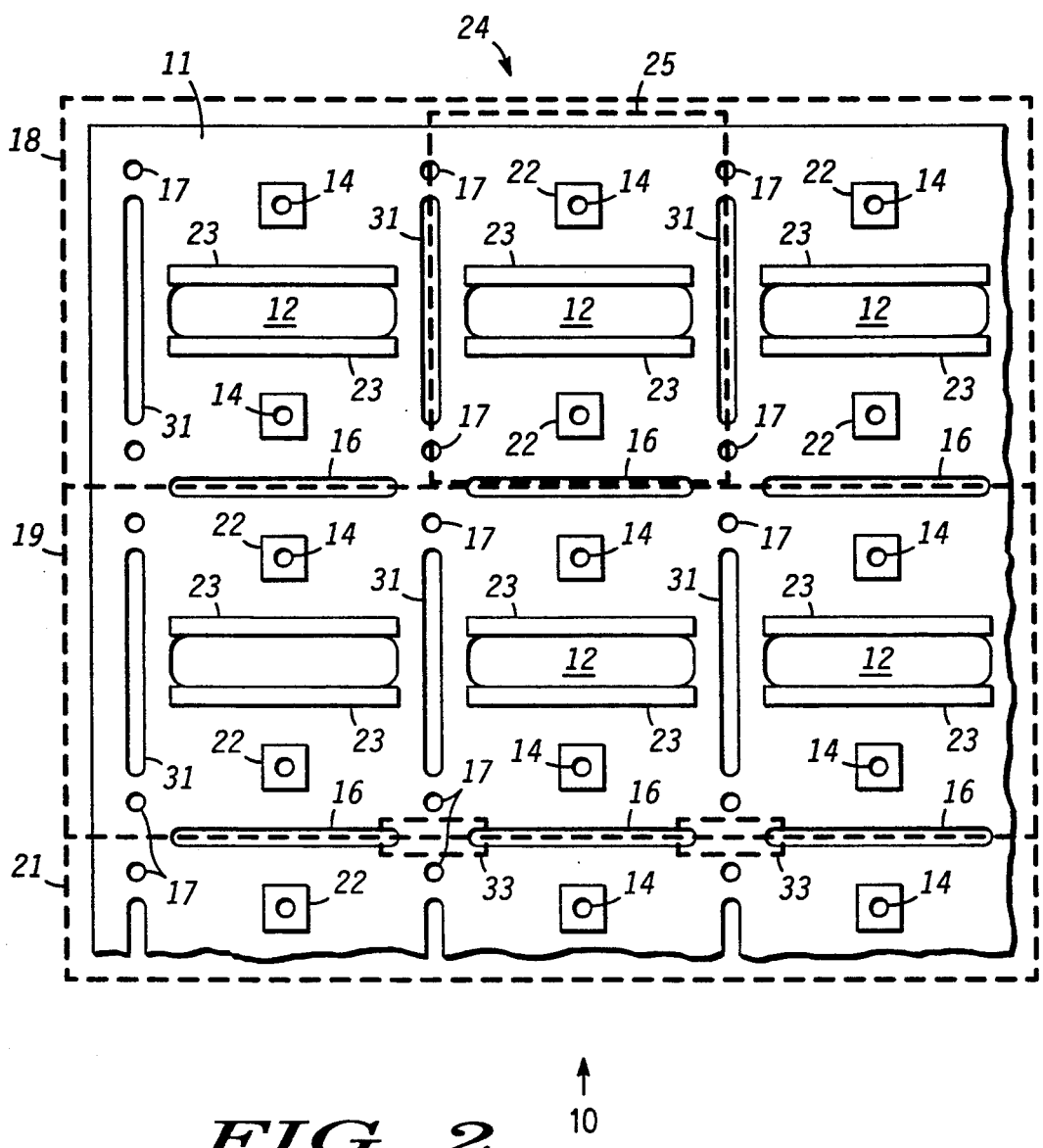
FIG. 2 illustrates a bottom view of the panel of FIG. 1 in accordance with the present invention.

FIG. 2 illustrates a second or bottom surface of panel 10 of FIG. 1. Elements of FIG. 2 that are the same as FIG. 1 have the same reference numerals. Surrounding each hole 14 is a lead attachment area 22 that is formed as a metallized area attached to the bottom surface of insulating sheet 11. Area 22 is electrically connected to pad 13 of FIG. 1 through hole 14. As will be seen hereinafter, area 22 is used to attach leadframe 24 to an electronic circuit board, module, or other suitable circuit substrate. In the preferred embodiment, area 22 is configured as a square having sides approximately 1.0 to 1.5 millimeters long in order to ensure that area 22 easily aligns with corresponding attachment pads on a module or electronic printed circuit board. Positioned adjacent to each opening 12 is a plurality of metallized sections that form a plurality of electrically isolated heatsink attach areas 23. Subsequently, areas 23 are utilized in attaching a heatsink to the bottom surface of each leadframe 24. In the preferred embodiment, each heatsink attach area 23 has a length that is longer than the length of opening 12 to facilitate attaching a heatsink that completely covers opening 12.

Figure 3:
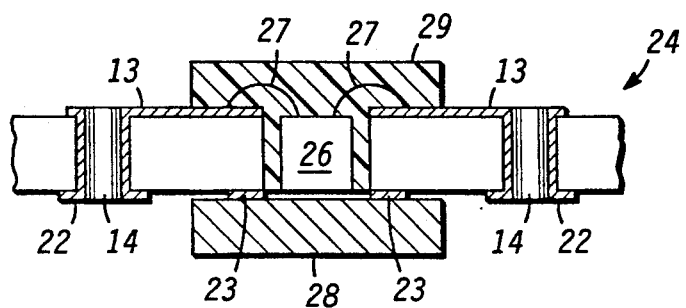
FIG. 3 illustrates a cross-section of a semiconductor package in accordance with the present invention.

FIG. 3 is a cross-sectional illustration of a semiconductor package 20 that utilizes leadframe 24 of FIG. 1 and FIG. 2. Elements of FIG. 3 that are the same as elements in FIG. 1 and FIG. 2 have the same reference numerals. A top or first surface of a high thermal conductivity heatsink 28 is attached to heatsink attach areas 23. In the preferred embodiment, heatsink 28 is formed from a material that has a thermal conductivity, greater than approximately 230 watts/meter-degree Kelvin, in order to provide package 20 with a thermal dissipation capability greater than approximately 1.0 watt. Suitable materials for heatsink 28 include a metallized aluminum nitride slug, a copper slug that is plated with nickel then gold, and a copper slug that is plated with tin or nickel. In the preferred embodiment, heatsink 28 is formed from copper plated with a layer of nickel followed by gold.

A semiconductor die 26 is die bonded to the top surface of heatsink 28, and a plurality of bonding wires 27 are utilized to interconnect die 26 to bonding pads 13 on the top surface of leadframe 24. In order to minimize the length of bonding wires 27, the surface of die 26 is substantially planar to the top surface of leadframe 24. Consequently, the thickness of leadframe 24 is substantially equal to the thickness of die 26.

Some semiconductor die require eutectic die bonding at temperatures greater than 400° C. Since such temperatures may damage leadframe 24, such die are attached to heatsink 28 prior to attaching heatsink 28 to leadframe 24.

Optionally, a package body 29 encapsulates and protects die 26 and bonding wires 27. Body 29 typically is a plastic encapsulant that is formed by methods that include injection molding, over molding, silicone or epoxy encapsulation, and other comparable encapsulation techniques. Lead attach areas 22 are electrically connected to die 26 through hole 14, and function as leads that provide a means for electrically and mechanically attaching package 20 in an electrical circuit.

In the preferred embodiment, a plurality of heatsinks, such as heatsink 28, are simultaneously attached to a leadframe strip, such as strips 18, 19, and 21 of FIG. 1 and FIG. 2, prior to singularizing each leadframe 24 from panel 10 (FIG. 1). Typically, the plurality of heatsinks are arranged in a pattern that matches the pattern of plurality of openings 12 (FIG. 1 and FIG. 2). Then, a high temperature solder that melts at temperatures above approximately 280° C. is applied to each heatsink 28. The leadframe strip is then placed on the plurality of heatsinks so that heatsink attach areas 23 are in contact with the plurality of heatsinks. Thereafter, the leadframe strip and the plurality of heatsinks are heated to reflow the solder and attach the plurality of heatsinks. Die 26 and bonding wires 27 are attached at temperatures below the melting point of the solder used to attach heatsink 26. For heatsinks having a eutectically attached semiconductor die, as explained hereinbefore, the die attach has been previously accomplished and only the wire bonding is performed at this stage. Therefore, the position of die 26 relative to pads 13 is accurately controlled thereby permitting accurate control of the length of wires 27. Controlling the length of wires 27 facilitates minimizing the inductive load that package 20 presents to die 26. Subsequently, package 20 is assembled in a circuit by using a solder that melts at temperatures between approximately 180° and 210° C. Therefore, assembling package 20 into a circuit does not melt the high temperature solder on heatsink 28. Consequently, heatsink 28 remains firmly attached to leadframe 24 and does not disturb the position of die 26 relative to bonding pads 13 and opening 12 (FIG. 1).

By now it should be appreciated that there has been provided a novel leadframe strip that includes a plurality of insulated leadframes. The insulated leadframes are suitable for use in forming high thermal conductivity semiconductor packages. Using a printed circuit board as the package's leadframe facilitates forming a large quantity of insulated leadframes in one leadframe panel thereby substantially eliminating the cost of assembling a leadframe from multiple piece parts. Forming the panel into leadframe strips facilitates handling the insulated leadframe in a manner similar to typical semiconductor package leadframes thereby further lowering semiconductor package costs. Firmly attaching the heatsink to the leadframe prior to die attach and wire bonding prevents the heatsink from moving during these operations thereby providing accurate control over the bonding wire's length and inductance.

We claim:

1. A leadframe strip for semiconductor packages comprising:
   a substantially planar sheet of insulating material having a first surface and a second surface;
   a plurality of die attach openings through the sheet of insulating material wherein each die attach opening has sides which have a length;
   a plurality of bonding pads on the first surface of the sheet of insulating material wherein the plurality of bonding pads are first metallized areas positioned adjacent each die attach opening so that each bonding pad has a length approximately equal to the length of the side of the die attach opening, and wherein each bonding pad has a metallized projection that extends perpendicularly away from the die attach opening approximately at the center of each bonding pad;

an electrically conductive hole through each metallized projection wherein the electrically conductive hole is distal from the die attach opening;

a plurality of heatsink attach areas on the second surface of the sheet of insulating material wherein the plurality of heatsink attach areas are second metallized areas adjacent each side of each die attach opening, and wherein each heatsink attach area has a length that is longer than the length of the sides of the die attach opening, and wherein each second metallized area is isolated from the electrically conductive hole for the purpose of attaching a heatsink on the second surface so that the heatsink overlays the die attach opening; and a plurality of leadframe attach areas on the second surface of the sheet of insulating material wherein the plurality of leadframe attach areas are third metallized areas that surround each electrically conductive hole and are electrically connected to the electrically conductive hole.

2. The leadframe strip of claim 1 further including a plurality of leadframe separation slots through the sheet of insulating material wherein the plurality of leadframe separation slots are centered to the plurality of die attach openings and are positioned perpendicularly to the die attach opening.

3. The leadframe strip of claim 2 further including a plurality of indexing holes through the sheet of insulating material wherein the plurality of indexing holes are centered to an end of the plurality of leadframe separation slots.

4. The leadframe strip of claim 1 wherein the substantially planar sheet of insulating material includes a bismaleimide triazine epoxy printed circuit board.

5. The leadframe strip of claim 1 wherein the plurality of die attach openings through the sheet of insulating material each include a die attach opening having a rectangular shape with two long sides.

6. The leadframe strip of claim 5 wherein the length of the die attach opening is approximately 1.5 to 1.8 millimeters.

7. The leadframe strip of claim 1 wherein the plurality of leadframe attach areas each have a rectangular shape and have sides that are between 1.0 and 1.5 millimeters long.

8. A leadframe strip for semiconductor devices comprising:

a substantially planar insulating sheet having a first surface and a second surface;

a die attach opening through the planar insulating sheet;

a plurality of wire bond pads on the first surface of the insulating sheet and positioned adjacent to the die attach opening wherein the wire bond pads are thin metallized areas on the insulating sheet;

a conductive hole through each wire bond pad of the plurality of wire bond pads, and through the insulating sheet;

a plurality of heatsink attach areas on the second surface of the sheet, the plurality of heatsink attach areas positioned adjacent sides of the die attach opening wherein each heatsink attach area is electrically isolated from all wiring bond pads of the plurality of wire bond pads by the planal insulating sheet; and a plurality of lead attach areas for attaching the leadframe strip to external structures wherein the plurality of lead attach areas are thin metallized areas on the second surface of the insulating sheet, and wherein the conductive hole electrically connects a wire bond pad to a lead attach area of the plurality of lead attach areas.

9. The leadframe strip of claim 8 wherein the die attach opening includes a rectangular die attach opening have a length of approximately 1.5 to 1.8 millimeters.

10. The leadframe strip of claim 8 further comprising:

a heatsink having a surface attached to the second surface of the planar insulating sheet wherein the surface of the heatsink overlays the die attach opening; and a semiconductor die having a first surface attached to a portion of the surface of the heatsink, and a second surface substantially planar with the first surface of the insulating sheet.

11. The leadframe strip of claim 10 wherein the heatsink having the surface attached to the second surface of the planar insulating sheet includes a copper slug that is covered with nickel and the nickel is covered with gold.

* * * * *